US009655238B2

(12) United States Patent
Kobayashi

(10) Patent No.: US 9,655,238 B2
(45) Date of Patent: May 16, 2017

(54) WIRING BOARD, METHOD FOR MANUFACTURING WIRING BOARD, AND ELECTRONIC DEVICE

(71) Applicant: SHINKO ELECTRIC INDUSTRIES CO., LTD., Nagano-shi, Nagano (JP)

(72) Inventor: Kazutaka Kobayashi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/698,276

(22) Filed: Apr. 28, 2015

(65) Prior Publication Data

US 2015/0319841 A1   Nov. 5, 2015

(30) Foreign Application Priority Data

Apr. 30, 2014   (JP) ................. 2014-094003

(51) Int. Cl.
| H05K 1/05 | (2006.01) |
| H05K 1/02 | (2006.01) |
| H05K 7/20 | (2006.01) |
| H05K 1/11 | (2006.01) |

(Continued)

(52) U.S. Cl.
CPC .......... *H05K 1/056* (2013.01); *H05K 1/0206* (2013.01); *H05K 1/0298* (2013.01); *H05K 1/09* (2013.01); *H05K 1/11* (2013.01); *H05K 1/181* (2013.01); *H05K 1/0256* (2013.01); *H05K 1/111* (2013.01); *H05K 7/205* (2013.01); *H05K 2201/0195* (2013.01); *H05K 2201/06* (2013.01); *H05K 2201/09227* (2013.01); *H05K 2201/10106* (2013.01); *H05K 2201/10969* (2013.01)

(58) Field of Classification Search
CPC ........ H05K 1/056; H05K 1/0298; H05K 1/09; H05K 1/11; H05K 1/181; H05K 1/0256; H05K 1/111; H05K 1/0201–1/0212; H05K 2201/0195; H05K 2201/06; H05K 2201/09227; H05K 2201/10106; H05K 2201/10969; H05K 7/205
USPC ........... 361/719–721; 174/252; 362/294, 373
See application file for complete search history.

(56) References Cited

U.S. PATENT DOCUMENTS

| 7,851,904 B2 | 12/2010 | Kozaka et al. |
| 8,698,186 B2 * | 4/2014 | Nguyen ............... H05K 1/0203 |
| | | 257/99 |

(Continued)

FOREIGN PATENT DOCUMENTS

| JP | 6-2734 | 1/1994 |
| JP | 8-125287 | 5/1996 |

(Continued)

*Primary Examiner* — Zachary M Pape
(74) *Attorney, Agent, or Firm* — Rankin, Hill & Clark LLP

(57) ABSTRACT

A wiring board includes a heat dissipation plate, a heat-conductive adhesive layer, an insulating layer, a thermal via, a heat dissipation metal terminal, and electrodes. The heat-conductive adhesive layer is disposed on the heat dissipation plate. The insulating layer is disposed on the heat-conductive adhesive layer. The insulating layer is formed with an opening portion. The thermal via is disposed in the opening portion of the insulating layer. The heat dissipation metal terminal is disposed on the thermal via and electrically connected to the heat dissipation plate. The electrodes are disposed on the insulating layer. The electrodes are to be connected to an electronic component.

13 Claims, 13 Drawing Sheets

(51) Int. Cl.
*H05K 1/18* (2006.01)
*H05K 1/09* (2006.01)

(56) References Cited

U.S. PATENT DOCUMENTS

| | | | | |
|---|---|---|---|---|
| 2010/0265665 A1* | 10/2010 | Kozaka | H05K 7/20963 | 361/717 |
| 2010/0295097 A1* | 11/2010 | Takenaka | H01L 29/402 | 257/194 |
| 2011/0290537 A1* | 12/2011 | Nagase | H01L 23/3677 | 174/251 |
| 2013/0192880 A1* | 8/2013 | Nakanishi | H05K 1/0201 | 174/251 |
| 2015/0200337 A1* | 7/2015 | Denda | H05K 1/115 | 257/99 |
| 2015/0230328 A1* | 8/2015 | Horikawa | H01L 23/145 | 174/252 |
| 2016/0345428 A1* | 11/2016 | Watanabe | H05K 1/0215 | |

FOREIGN PATENT DOCUMENTS

| | | |
|---|---|---|
| JP | 2008-166711 | 7/2008 |
| JP | 2013-157441 | 8/2013 |

* cited by examiner

FIG. 7

| Structure | Thickness of Layer(s) (μm) | | Insulation Property Between Heat Dissipation Plate and Electrodes | | Heat Resistance in Thickness Direction from Heat Generating Portion (°C/W) | Cost |
|---|---|---|---|---|---|---|
| | | | Dielectric Breakdown Voltage (kV) | Electric Discharge | | |
| Comparative Example 1 | Heat-Conductive Adhesive Layer | 100 | 4.6 | Occurred | 0.41 | Good |
| Comparative Example 2 | Polyimide Layer (Thermal Via: Copper) | 50 | 6.9 | Occurred | 0.25 | Good |
| | Heat-Conductive Adhesive Layer | 50 | | | | |
| Example 1 | Polyimide Layer (Thermal Via: Copper) | 50 | 6.9 | Not Occurred | 0.25 | Good |
| | Heat-Conductive Adhesive Layer | 50 | | | | |
| Example 2 | Polyimide Layer (Thermal Via: Resin) | 35 | 5.0 | Not Occurred | 0.31 | Very Good |
| | Heat-Conductive Adhesive Layer | 35 | | | | |

Comparative Example 1

WIRING BOARD, METHOD FOR MANUFACTURING WIRING BOARD, AND ELECTRONIC DEVICE

CROSS-REFERENCE TO RELATED APPLICATION(S)

This application claims priority from Japanese Patent Application No. 2014-094003, filed on Apr. 30, 2014, the entire contents of which are herein incorporated by reference.

BACKGROUND

Technical Field

Exemplary embodiments of the invention relate to a wiring board, a method for manufacturing a wiring board, and an electronic device.

Related Art

Wiring boards to be mounted with heat-generating electronic components such as a light emitting device have been known. In such wiring boards, a wiring layer is formed on a heat dissipation plate with a heat-conductive adhesive layer being interposed therebetween. An electronic component is mounted on the wiring layer. Heat generated by the electronic component is transmitted to the heat dissipation plate by the wiring layer and the heat-conductive adhesive layer, for dissipation.

SUMMARY

The heat-conductive adhesive layer is not sufficiently insulative because the heat-conductive adhesive layer contains an alumina filler to increase its thermal conductivity. If a thickness of the heat-conductive adhesive layer is increased to secure high insulation performance, the heat dissipation performance of the heat-conductive adhesive layer lowers.

Where the heat-conductive adhesive layer is a single layer, it is therefore difficult to attain both of high insulation performance and sufficient heat dissipation performance.

In view of the above, there has been proposed such a wiring board that a thermal via made of copper or the like is formed in an opening of an insulating layer and heat is transmitted to a heat dissipation plate via the thermal via and a heat-conductive adhesive layer. However, if a high voltage for driving an electronic component is applied between electrodes formed on the insulating layer in the wiring board provided with the thermal via, discharge may occur within the wiring board.

On exemplary embodiment provides a wiring board having a thermal via that prevents internal discharge, a method for manufacturing the wiring board, and an electronic device including the wiring board.

According to one aspect of the invention, a wiring board includes a heat dissipation plate, a heat-conductive adhesive layer, an insulating layer, a thermal via, a heat dissipation metal terminal, and electrodes. The heat-conductive adhesive layer is disposed on the heat dissipation plate. The insulating layer is disposed on the heat-conductive adhesive layer. The insulating layer is formed with an opening portion. The thermal via is disposed in the opening portion of the insulating layer. The heat dissipation metal terminal is disposed on the thermal via and electrically connected to the heat dissipation plate. The electrodes are disposed on the insulating layer. The electrodes are to be connected to an electronic component.

According to another aspect of the invention, a method for manufacturing a wiring board includes:

forming an opening portion through an insulating layer;

bonding a metal foil to one surface of the insulating layer;

forming a metal plating layer in the opening portion of the insulating layer by electrolytic plating using the metal foil as a plating power supply path, to form a thermal via;

patterning the metal foil to form a heat dissipation metal terminal on the thermal via and to form electrodes on the insulating layer;

bonding a heat dissipation plate to the other surface of the insulating layer with a heat-conductive adhesive layer interposed therebetween, the other surface of the insulating layer being opposed to the one surface of the insulating layer; and electrically connecting the heat dissipation metal terminal and the heat dissipation plate to each other.

In the above description, the insulating layer is disposed under the electrodes to be connected to the electronic component. The thermal via which is superior in heat dissipation performance is disposed under the heat dissipation metal terminal. The heat dissipation plate is disposed under the insulating layer and the thermal via with the heat-conductive adhesive layer interposed therebetween. The heat dissipation metal terminal and the heat dissipation plate are electrically connected to each other.

With this configuration, discharge does not occur within the wiring board even if a high voltage is applied between the electrodes, whereas high insulation performance is secured and the heat dissipation performance is enhanced.

BRIEF DESCRIPTION OF THE DRAWINGS

FIG. 7 is a table that summarizes dielectric breakdown voltages, occurrence of discharge, thermal resistivity values, and costs of wiring boards of Comparative Example 1, Comparative Example 2, Example 1, and Example 2;

DETAILED DESCRIPTION

Exemplary embodiments of the invention will be hereinafter described with reference to the accompanying drawings.

Figure 1:
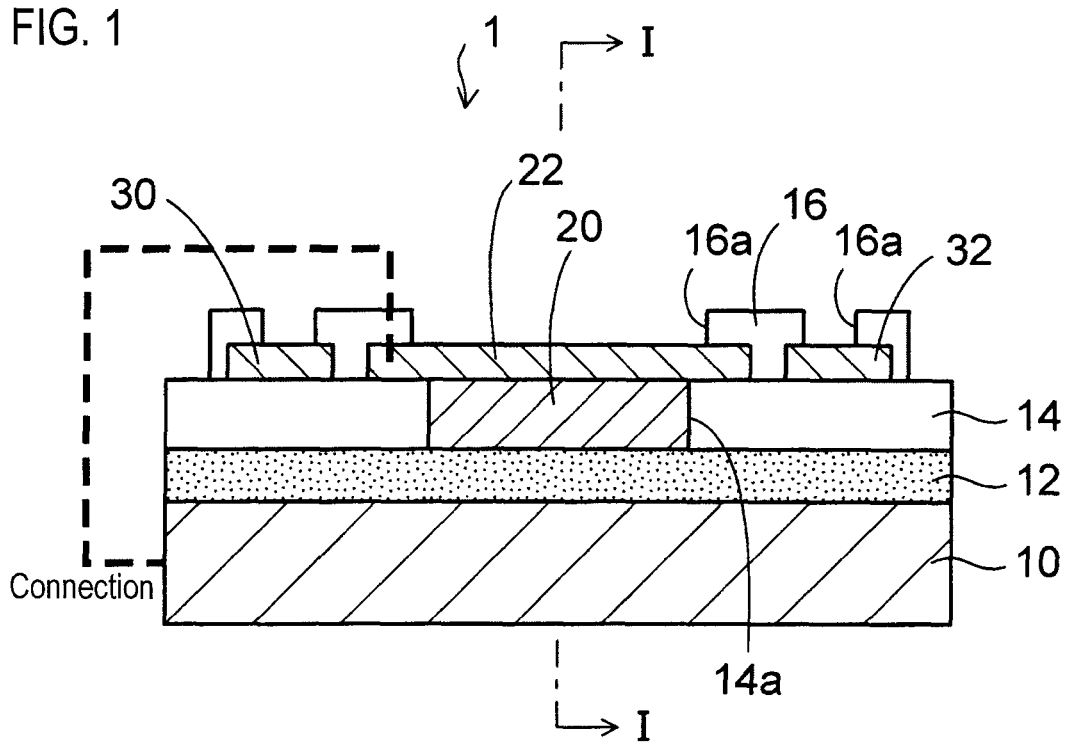
FIG. 1 is a sectional view of a wiring board according to an exemplary embodiment.

FIGS. 1 to 4 are drawings for explaining a wiring board 1 and an electronic device 2 according to one exemplary embodiment. As shown in FIG. 1, in the wiring board 1, a heat-conductive adhesive layer 12 is formed on a heat dissipation plate 10. The heat-conductive adhesive layer 12 has 20 μm to 50 μm in thickness. The heat dissipation plate 10 is about 1 mm in thickness. The heat dissipation plate 10 is made of a metal that is high in thermal conductivity, such as aluminum or copper.

The heat-conductive adhesive layer 12 is made of, for example, an epoxy resin containing an alumina filler that is high in thermal conductivity. Alternatively, the heat-conductive adhesive layer 12 may be made of a resin containing aluminum nitride or boron nitride (BN) instead of an alumina filler.

An insulating layer 14 is formed on the heat-conductive adhesive layer 12. The insulating layer 14 is formed with an opening portion 14a at a center thereof. The opening portion 14a penetrates through the insulating layer 14 in a thickness direction of the insulating layer 14. The insulating layer 14 is preferably a polyimide layer. The insulating layer 14 is 25 μm to 75 μm in thickness.

A heat dissipation metal layer 20 (an example of a thermal via) is formed in the opening portion 14a and on the heat-conductive adhesive layer 12. Alternatively, there may be provided plural opening portions 14a in the insulating layer 14. In this case, plural heat dissipation metal layers 20 may be disposed in the respective opening portions 14a of the insulating layer 14.

A heat dissipation metal terminal 22 is formed on the heat dissipation metal layer 20 so as to cover a region around and above the opening portion 14a of the insulating layer 14. The heat dissipation metal terminal 22 is in contact with and is connected to the heat dissipation metal layer 20. The heat dissipation metal layer 20 and the heat dissipation metal terminal 22 are made of, for example, copper.

A positive electrode 30 and a negative electrode 32 for connection to an electronic component are formed on the insulating layer 14 and outside the heat dissipation metal terminal 22. The positive electrode 30 and the negative electrode 32 are made of, for example, copper.

The heat dissipation metal terminal 22, the positive electrode 30, and the negative electrode 32 are formed by the same layer. For example, the heat dissipation metal terminal 22, the positive electrode 30, and the negative electrode 32 are formed by patterning a copper foil. Alternatively, the heat dissipation metal terminal 22, the positive electrode 30, and the negative electrode 32 may be bonded to an upper surface of the insulating layer 14 by an adhesive layer (not shown) having 1 μm to 10 μm in thickness.

A white solder resist layer 16 is formed on the insulating layer 14. Opening portions 16a are formed through the solder resist layer 16. The opening portions 16a are located above upper surfaces of the heat dissipation metal terminal 22, the positive electrode 30, and the negative electrode 32, respectively.

Furthermore, the wiring board 1 according to this exemplary embodiment, the heat dissipation metal terminal 22 and the heat dissipation plate 10 are electrically connected to each other. It is preferable that the heat dissipation metal terminal 22 and the heat dissipation plate 10 be grounded. The wiring board 1 according to this exemplary embodiment is configured in the above-described manner.

Now, let consider a wiring board 1x (see FIG. 2) that is configured so that the heat dissipation metal terminal 22, the heat dissipation metal layer 20, and the heat dissipation plate 10 of the wiring board 1 shown in FIG. 1 are floating conductors that are relevant to no electric circuits.

Figure 2:
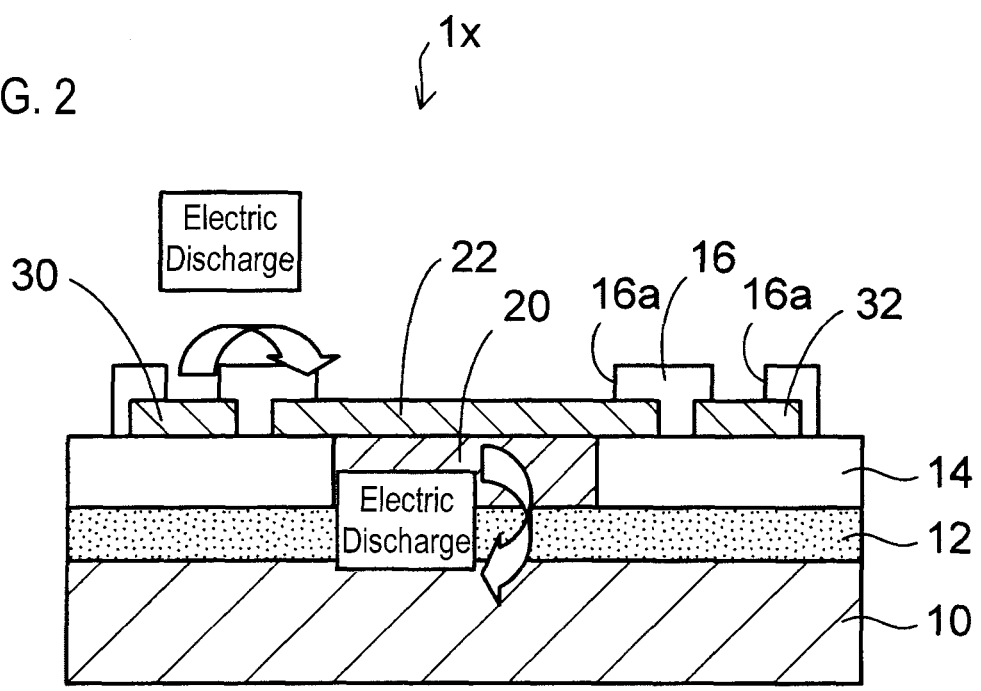
FIG. 2 is a sectional view illustrating how discharge occurs in the wiring board shown in FIG. 1.

In this case, as shown in FIG. 2, if a high voltage for driving an electronic component is applied between the positive electrode 30 and the negative electrode 32, discharge would occur between (i) the positive electrode 30 or the negative electrode 32 and (ii) the heat dissipation metal terminal 22 adjacent to the positive electrode 30 or the negative electrode 32. Furthermore, discharge would occur between the heat dissipation plate 10 and the heat dissipation metal layer 20 which is connected to the heat dissipation metal terminal 22. As a result, the wiring board 1 would be destroyed.

In this exemplary embodiment, as a countermeasure against the above phenomenon, the heat dissipation metal terminal 22 and the heat dissipation plate 10 of the wiring board 1 are electrically connected to each other.

With this measure, even if a high voltage is applied between the positive electrode 30 and the negative electrode 32, the heat dissipation metal terminal 22 and the heat dissipation plate 10 are at the same potential. Therefore, occurrence of discharge between the heat dissipation plate 10 and the heat dissipation metal layer 20 which is connected to the heat dissipation metal terminal 22 can be prevented.

Figure 3:
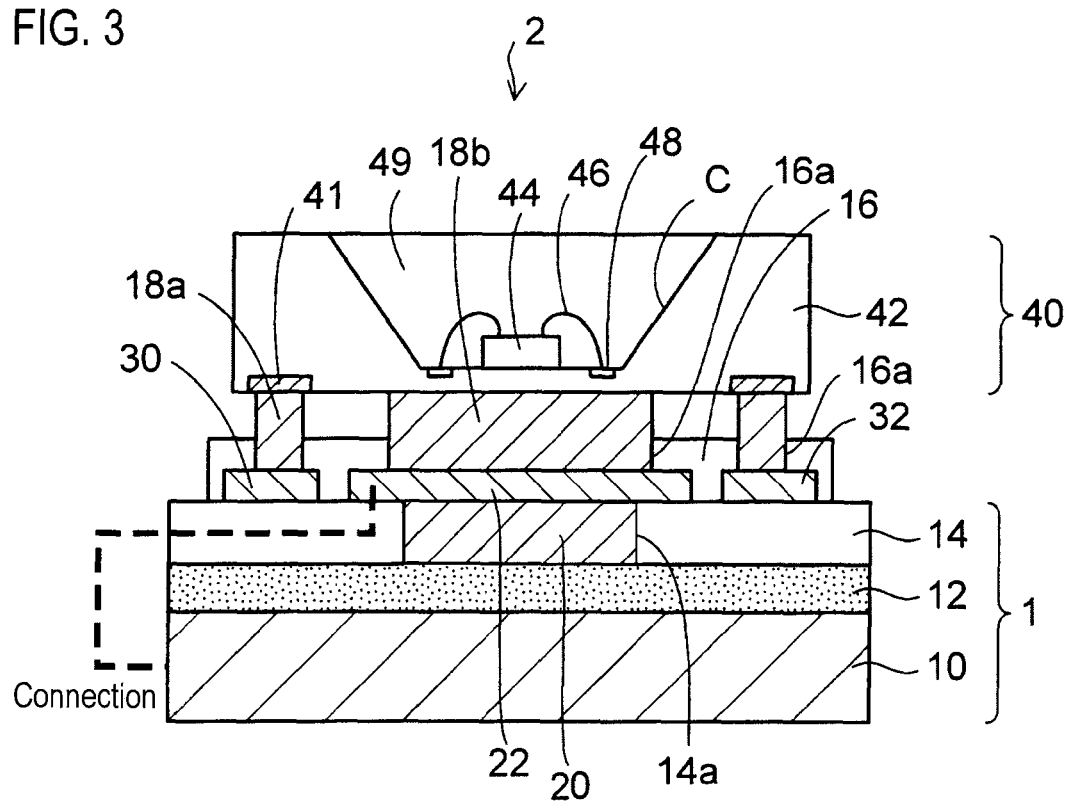
FIG. 3 is a sectional view of an electronic device that includes the wiring board according to the exemplary embodiment.

FIG. 3 shows the electronic device 2 according to this exemplary embodiment. As shown in FIG. 3, the electronic device 2 is configured in such a manner that an LED component 40 is mounted on the wiring board 1 shown in FIG. 1. The LED component 40 is an example of an electronic component. Another example of the electronic component is a power semiconductor component.

In the LED component 40, an upper surface of a ceramic sub-mount board 42 is formed with a recess portion C. An LED element 44 is placed on a bottom surface of the recess portion C.

The LED element 44 is connected to connection electrodes 48 by wires 46. The connection electrodes 48 are formed in the sub-mount board 42. The LED element 44 is sealed by a transparent sealing resin 49. The sealing resin 49 may be made of a resin containing a phosphor component.

Connection terminals 41 of the LED component 40 are connected to the positive electrode 30 and the negative electrode 32 of the wiring board 1 through solder members 18a. A lower surface of the LED component 40 is connected to the heat dissipation metal terminal 22 through a solder layer 18b.

The single heat dissipation metal layer 20 is disposed in a region where the LED component 40 is mounted. Alternatively, there may be provided plural heat dissipation metal layers 20 in the region where the LED component 40 is mounted. Also, the single heat dissipation metal terminal 22 is placed on the heat dissipation metal layer 20 in the region where the LED component 40 is mounted. Alternatively, there may be provided plural heat dissipation metal terminals on the heat dissipation metal layer(s) 20 in the region where the LED component 40 is mounted.

A voltage is applied to the LED component 40 via the positive electrode 30 and the negative electrode 32. Thereby, light is emitted from the LED element 44 to the outside.

Heat that is generated by the LED component 40 is transmitted to the heat dissipation plate 10 via the underlying solder layer 18b, heat dissipation metal terminal 22, heat dissipation metal layer 20 (an example of the thermal via), and heat-conductive adhesive layer 12.

In FIG. 3, the heat dissipation metal layer 20 serves as a thermal via that is made of a metal having high heat dissipation property, such as copper. Thus, high heat dissipation performance can be attained The insulating layer 14 is disposed under the positive electrode 30 and the negative electrode 32. The insulating layer 14 such as a polyimide layer is highly insulative. Therefore, even if a high voltage is applied between the positive electrode 30 and the negative electrode 32, no dielectric breakdown occurs.

Figure 4:
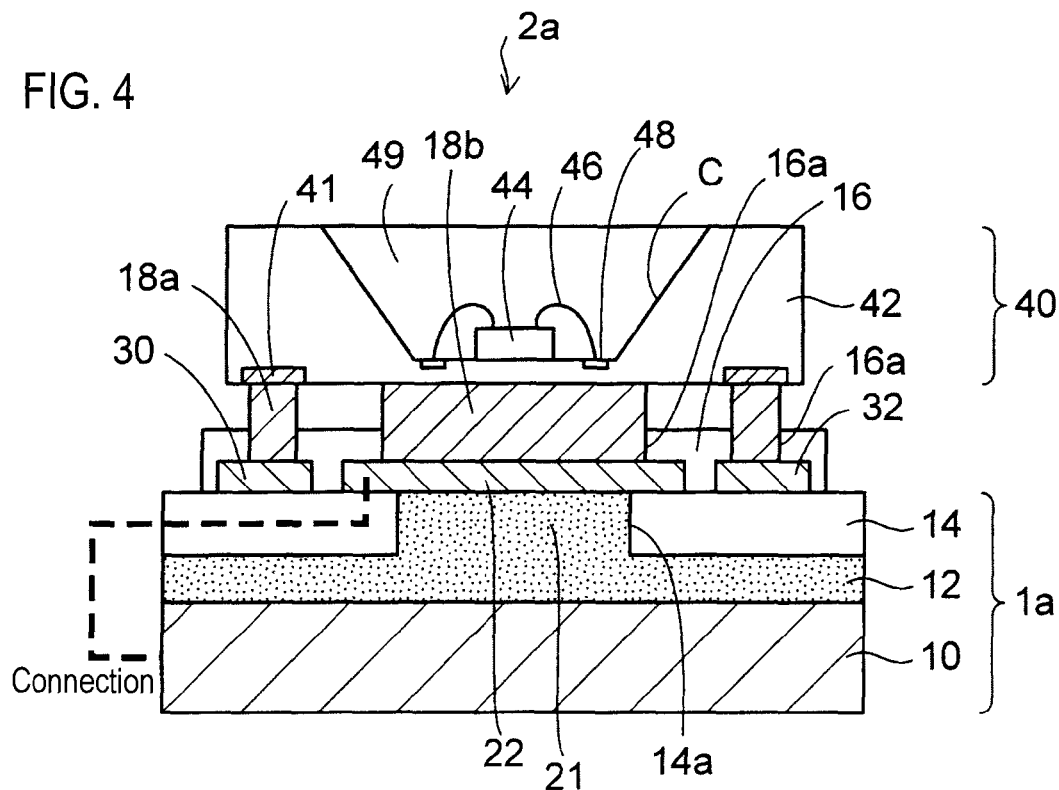
FIG. 4 is a sectional view of an electronic device that includes a wiring board according to a modification example of the exemplary embodiment.

FIG. 4 shows an electronic device 2a that is equipped with a wiring board 1a according to a modification example of the exemplary embodiment. In place of the configuration shown in FIG. 3 that the heat dissipation metal layer 20 is disposed in the opening portion 14a of the insulating layer 14 of the wiring board 1, a heat dissipation resin layer 21 made of the same material as the heat-conductive adhesive layer 12 is disposed in the opening portion 14a of the insulating layer 14 of the wiring board 1a as shown in FIG. 4. The heat dissipation resin layer 21 is an example of the thermal via.

The heat dissipation metal terminal 22 and the heat dissipation plate 10 are connected to each other in a similar manner to FIG. 1.

The wiring board 1a according to the modification example can be made lower in manufacturing cost than the wiring board 1 shown in FIG. 1, while sufficient heat dissipation performance is secured. Unlike the heat dissipation metal layer 20, the heat dissipation resin layer 21 can be formed simultaneously with the heat-conductive adhesive layer 12 without using a plating technique. Thus, the manufacturing cost can be lowered.

Next, description will be given on a specific method for electrically connecting the heat dissipation metal terminal 22 and the heat dissipation plate 10 of the wiring board 1 shown in FIG. 1.

Figure 5:
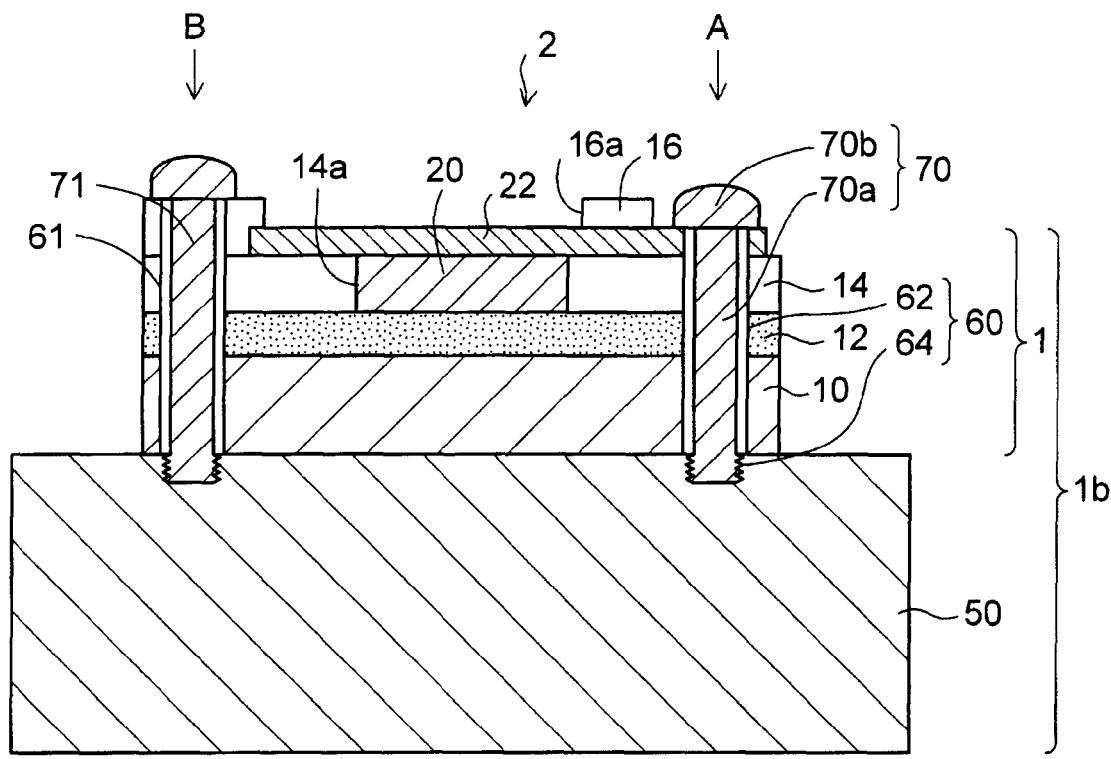
FIG. 5 is a sectional view, taken along a line I-I in FIG. 1, illustrating a first method for electrically connecting a heat dissipation metal terminal and a heat dissipation plate of the wiring board according to the exemplary embodiment.

FIG. 5 is a sectional view illustrating a method for electrically connecting the heat dissipation metal terminal 22 and the heat dissipation plate 10 of the wiring board 1 according to the exemplary embodiment. FIG. 5 is a sectional view taken along a line I-I in FIG. 1. That is, FIG. 5 is a sectional view taken along a line perpendicularly to the sheet of FIG. 1.

In a wiring board 1b shown in FIG. 5, the heat dissipation plate 10 of the wiring board 1 shown in FIG. 1 is placed on an upper surface of a metal support body 50. The heat dissipation plate 10 of the wiring board 1 is in contact with the upper surface of the metal support body 50. Thus, the wiring board 1b shown in FIG. 5 is configured in such a manner that the metal support body 50 is added to the wiring board 1 shown in FIG. 1.

For example, the metal support body 50 is, for example, a member that is a part of a casing of an electronic apparatus incorporating an electronic device such as an LED device. Alternatively, the metal support body 50 may be an independent metal plate. The metal support body 50 is made of stainless steel, aluminum, copper, or the like.

A through hole 62 is formed in a pad region A defined in the heat dissipation metal terminal 22 of the wiring board 1. The through hole 62 penetrates through the heat dissipation metal terminal 22, the insulating layer 14, the heat-conductive adhesive layer 12, and the heat dissipation plate 10 in thickness directions thereof. The metal support body 50 is formed with a screw hole 64. The screw hole 64 is located at such a position where the screw hole 64 corresponds to the through hole 62. In other words, the screw hole 64 is formed so as to be able to communicate with the through hole 62. A side surface of the screw hole 64 is threaded. The through hole 62 and the screw hole 64 make up a screwing hole 60.

An attachment screw (bolt) 70 is inserted into the through hole 62 of the wiring board 1. The attachment screw 70 includes a rod-like shank portion 70a and a head portion 70b. The head portion 70a has a larger diameter than the shank portion 70a. A tip end portion of the shank portion 70a is threaded.

The threads of the attachment screw 70 are screwed into the screw hole 64 of the metal support body 50. A gap is formed between the attachment screw 70 and a side surface of the through hole 62 of the wiring board 1. By screwing the attachment screw 70 into the screw hole 64, a lower surface of the head portion 70b of the attachment screw 70 comes into contact with the upper surface of the heat dissipation metal terminal 22. As a result the lower surface of the head portion 70b of the attachment screw 70 presses the heat dissipation metal terminal 22 downward.

As described above, the attachment screw 70 is screwed into the screwing hole 60 extending from the upper surface of the heat dissipation metal terminal 22 to the metal support body 50. As a result, the heat dissipation metal terminal 22 is electrically connected to the heat dissipation plate 10 via the attachment screw 70 and the metal support body 50. It is preferable that the metal support body 50 be grounded.

Likewise, a through hole 61 is formed in a predetermined edge side region B. In the edge side region B, no part of the heat dissipation metal terminal 22 of the wiring board 1 is provided. The through hole 61 extends from the upper surface of the solder resist layer 16 to the metal support body 50. Then, an attachment screw 71 is screwed into the through hole 61 in a similar manner.

As described above, the wiring board 1 shown in FIG. 1 is fixed to the metal support body 50 by the attachment screws 70, 71. Also, the heat dissipation metal terminal 22 of the wiring board 1 is electrically connected to the heat dissipation plate 10 by the attachment screw 70.

Figure 6:
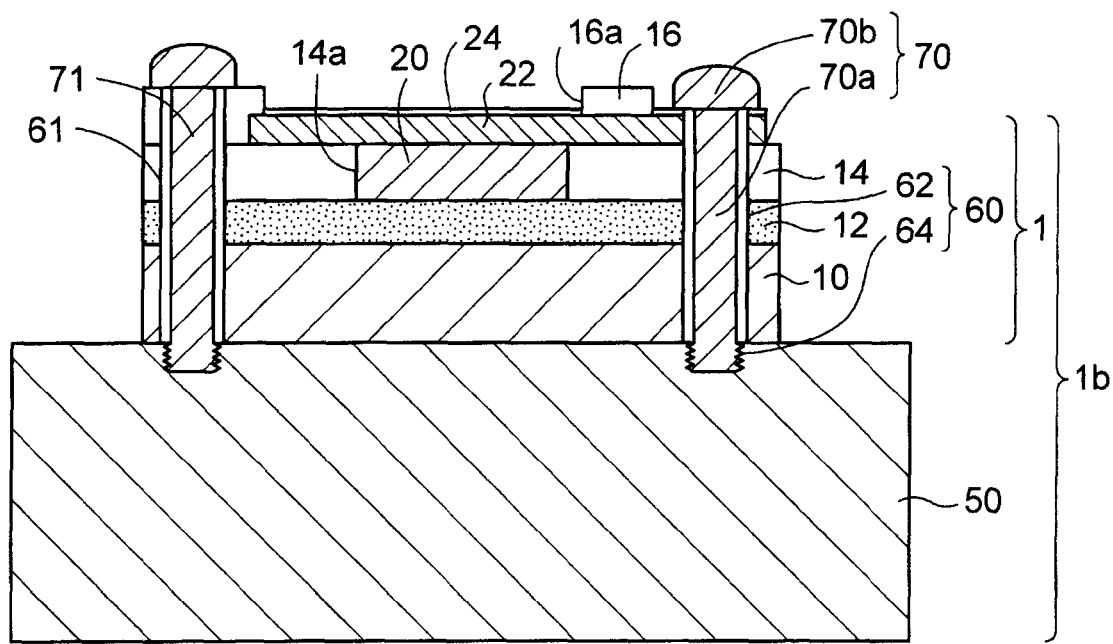
FIG. 6 is a sectional view illustrating a second method for electrically connecting the heat dissipation metal terminal and the heat dissipation plate of the wiring board according to the exemplary embodiment.

As shown in FIG. 6, a contact layer 24 may be formed on the upper surface of the heat dissipation metal terminal 22 of the wiring board 1 shown in FIG. 5. The contact layer 24 includes, for example, a nickel (Ni) plating layer and a gold (Au) plating layer in this order from the bottom. In this exemplary embodiment, the lower surface of the head portion 70b of the attachment screw 70 is brought into contact with the heat dissipation metal terminal 22 and thereby electrically connected to the heat dissipation metal terminal 22.

In FIG. 6, the contact layer 24 having low electric resistivity is formed on the upper surface of the heat dissipation metal terminal 22. Therefore, even if a contact area between the head portion 70b of the attachment screw 70 and the contact layer 24 is small, a contact resistance therebetween can be reduced. As a result, stable electrical continuity therebetween can be secured.

The wiring board 1b shown in FIG. 6 is the same as that shown in FIG. 5 except that in FIG. 6, the contact layer 24 is formed on the upper surface of the heat dissipation metal terminal 22.

In the above methods for connecting electrically connecting the heat dissipation metal terminal 22 and the heat dissipation plate 10 of the wiring board 1, the heat dissipation metal terminal 22 of the wiring board 1 and the metal support body 50 are connected to each other by the attachment screw 70.

Alternatively, another method may be employed. For example, the heat dissipation metal terminal 22 and the heat dissipation plate 10 are electrically connected to each other by connecting the heat dissipation metal terminal 22 of the wiring board 1 and the metal support body 50 by wires provided by the wire bonding method.

Further alternatively, the heat dissipation plate 10 of the electronic device 2 shown in FIG. 3 or the heat dissipation plate 10 of the electronic device 2a shown in FIG. 4 is disposed so as to be in contact with a bottom plate of a metal socket. An electrode of a lid that is connected to the bottom plate via side walls is brought into contact with the heat dissipation metal terminal 22. In this case, the heat dissipation metal terminal 22 of the wiring board 1 is electrically connected to the heat dissipation plate 10 via the lid, side walls, and bottom plate of the socket.

Still further alternatively, a portion to be connected to the heat dissipation metal terminal 22 is added to a socket connector which is to be connected to the positive electrode 30 and the negative electrode 32 of the wiring board 1. The heat dissipation metal terminal 22 and the heat dissipation plate 10 are electrically connected to each other by connecting the heat dissipation metal terminal 22 of the wiring board 1 to the metal support body 50 using the socket connector.

As exemplified above, in the invention, various connection methods may be employed. Any method can be employed so long as the heat dissipation metal terminal 22 and the heat dissipation plate 10 of the wiring board 1 are electrically connected to each other.

FIG. 7 is a table which summarizes dielectric breakdown voltages, occurrence of discharge, thermal resistance values, and costs of a wiring board 5 of Comparative Example 1 (FIG. 8), the wiring board 1x of Comparative Example 2 (FIG. 2), the wiring board 1 of Example 1 (FIG. 1), and the wiring board 1a of Example 2 (FIG. 4).

Figure 8:
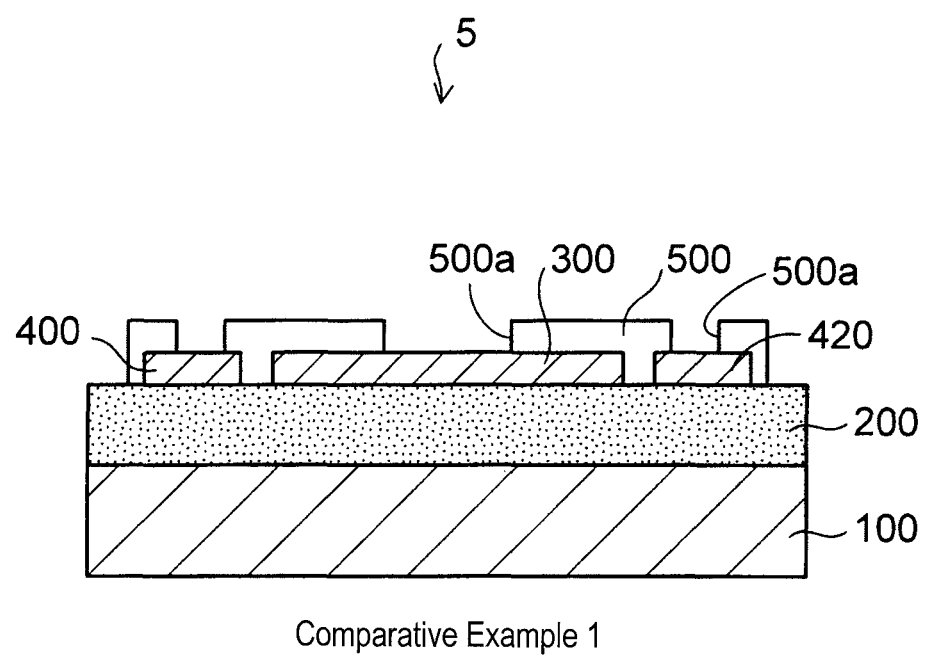
FIG. 8 is a sectional view showing the structure of the wiring board of Comparative Example 1 indicated in the table of FIG. 7.

As for the structure of the wiring board 5 of Comparative Example 1 indicated in the table of FIG. 7, a heat-conductive adhesive layer 200 is placed on a heat dissipation plate 100 (see FIG. 8). A positive electrode 400, a negative electrode 420, and a heat dissipation metal terminal 300 are formed on the heat-conductive adhesive layer 200. The positive electrode 400 and the negative electrode 420 are to be connected to an electronic component.

A solder resist layer 500 is formed on the heat-conductive adhesive layer 200. The solder resist layer 500 is formed with opening portions 500a over the heat dissipation metal terminal 300, the positive electrode 400, and the negative electrode 420, respectively.

The heat-conductive adhesive layer 200 is made of an epoxy resin containing an aluminum filler. The heat-conductive adhesive layer 200 has 3 W/m·K in thermal conductivity. The heat-conductive adhesive layers 12 of the wiring boards 1x, 1, 1a of Comparative Example 2, Example 1, and Example 2 are made of the same material as the heat-conductive adhesive layer 200.

At first, comparisons will be made on the dielectric breakdown voltages and the thermal resistance values. In the wiring board 5 of Comparative Example 1 (FIG. 8), a thickness of the heat-conductive adhesive layer 200 needs to be as thick as about 100 μm because there is only provided the heat-conductive adhesive layer 200 as an insulating layer.

The dielectric breakdown voltage of the heat-conductive adhesive layer 200 which is formed between (i) the heat dissipation plate 100 and (ii) the positive electrode 400 and the negative electrode 420 is about 4.6 kV. It is noted that the dielectric breakdown voltage of 4.6 kV is obtained based on physical properties and thickness of the heat-conductive adhesive layer 200. If the product specification requires that the dielectric breakdown voltage specification is 5 kV or higher, the wiring board 5 of Comparative Example 1 (FIG. 8) is determined to be defective.

Also, a voltage of 1 kV was applied between the positive electrode 400 and the negative electrode 420 of the wiring board 5 for 2 seconds. This test was performed without an LED component 40 or the like being placed on the wiring board 5. That is, the positive electrode 400 and the negative electrode 420 were electrically insulated from each other. During the test, a current of 1 mA or more flew through the negative electrode 420. This test result indicates that discharge occurred between (i) the heat dissipation metal terminal 300 and (ii) the positive electrode 400 and/or the negative electrode 420, which caused a short circuit therebetween. That is, discharge occurred within the wiring board 5 of Comparative Example 1 (FIG. 8).

In the wiring board 5 of Comparative Example 1 (FIG. 8), a thermal resistance—in the thickness direction (upper and lower directions in the sheet of FIG. 8)—of a portion under the heat dissipation metal terminal 300 is as large as 0.41° C./W. Thus, the wiring board 5 is not sufficient in heat dissipation performance. This is because the thermal conductivity 3 W/m·K of the heat-conductive adhesive layer 200 is not sufficiently high. It is noted that the thermal resistance of 0.41° C./W is obtained based on physical properties of the heat dissipation metal terminal 300, heat-conductive adhesive layer 200, and heat dissipation plate 100.

In the wiring board 1 of Example 1 (FIG. 1), the thermal via is made of copper. Also, the heat-conductive adhesive layer 12 and the insulating layer 14 (polyimide layer) each has 50 μm in thickness.

The dielectric breakdown voltage of the wiring board 1 of Example 1 (FIG. 1) is obtained by measuring a breakdown voltage of a lamination film which includes the insulating layer 14 (polyimide layer) and the heat-conductive adhesive layer 12 and which is disposed between (i) the heat dissipation plate 10 and (ii) the positive electrode 30 and the negative electrode 32.

The wiring board 1 of Example 1 (FIG. 1) includes the highly insulative polyimide layer. Therefore, the dielectric breakdown voltage of the wiring board 1 of Example 1 is about 6.9 kV which meets the product specification.

Also, a voltage of 1 kV was applied between the positive electrode 30 and the negative electrode 32 of the wiring board 1 for 2 seconds. This test was performed without an LED component 40 or the like being placed on the wiring board 1. That is, the positive electrode 30 and the negative electrode 32 were electrically insulated from each other. During the test, a current flew through the negative electrode 32 was substantially zero mA. This test result indicates that discharge did not occur between (i) the heat dissipation metal terminal 22 and (ii) the positive electrode 30 and the negative electrode 32. That is, discharge did not occur within the wiring board 1 of Example 1 (FIG. 1).

Also, the wiring board 1 of Example 1 (FIG. 1) includes the thermal via which is made of copper. The thermal resistance—in the thickness direction (upper and lower directions in the sheet of FIG. 1)—of a portion under the heat-conductive adhesive layer 22 is as small as 0.25° C./W. That is, the wiring board 1 is high in heat dissipation performance. This is because the thermal conductivity of copper is 300 W/m·K which is much higher than 3 W/m·K of the heat-conductive adhesive layer 12.

In the wiring board 1*x* of Comparative Example 2 (FIG. 2) indicated in the table of FIG. 7, the heat dissipation metal terminal 22 is electrically floating. Therefore, discharge may occur within this structure. More specifically, a voltage of 1 kV was applied between the positive electrode 30 and the negative electrode 32 of the wiring board 1*x* for 2 seconds. This test was performed without an LED component 40 or the like being placed on the wiring board 1*x*. That is, the positive electrode 30 and the negative electrode 32 were electrically insulated from each other. During the test, a current of 1 mA or more flew through the negative electrode 32. Similarly to Comparative Example 1, this test result indicates that discharge occurred within the wiring board 1*x* of Comparative Example 2.

The wiring board 1*x* of Comparative Example 2 (FIG. 2) is the same as the wiring board 1 of Example 1 (FIG. 1) in the other characteristics.

The thermal via (heat dissipation resin layer 21) in the wiring board 1*a* of Example 2 (FIG. 4) is made of the resin. In order to reduce the thermal resistance, the insulating layer 14 (polyimide layer) and the heat-conductive adhesive layer 12 are each as thin as 35 μm.

The dielectric breakdown voltage of the wiring board 1*a* of Example 2 (FIG. 4) is obtained by measuring a breakdown voltage of a lamination film including the insulating layer 14 (polyimide layer) and the heat-conductive adhesive layer 12. The dielectric breakdown voltage of the wiring board 1*a* of Example 2 is 5 kV. The dielectric breakdown voltage of the wiring board 1*a* of Example 2 (FIG. 4) meets the product specification, while being lower than that of the wiring board 1 of Example 1 (FIG. 1).

Also, a voltage of 1 kV was applied between the positive electrode 30 and the negative electrode 32 of the wiring board 1*a* for 2 seconds. This test was performed without an LED component 40 or the like being placed on the wiring board 1*a*. That is, the positive electrode 30 and the negative electrode 32 were electrically insulated from each other. During the test, a current flew through the negative electrode 32 was substantially zero mA. Similarly to Example 1, this test result indicates that discharge did not occur between (i) the heat dissipation metal terminal 22 and (ii) the positive electrode 30 and the negative electrode 32. That is, discharge did not occur within the wiring board 1*a* of Example 2 (FIG. 4).

The wiring board 1*a* of Example 2 (FIG. 4) has the thermal via which is made of the resin. The thermal resistance—in the thickness direction (upper and lower directions in the sheet of FIG. 4)—of a portion under the heat-conductive metal terminal 22 is about 0.31° C./W. Thus, the wiring board 1*a* is lower in heat dissipation performance than the wiring board 1 of Example 1 (FIG. 1) having the copper thermal via.

Although the thermal resistance of the wiring board 1*a* of Example 2 (FIG. 4) is somewhat large because of the resin thermal via, the wiring board 1*a* of Example 2 meets the product specification. Furthermore, of Examples and Comparative Examples, the structure of the wiring board 1*a* of Example 2 is the most advantageous in terms of cost.

As for discharge within the wiring board, discharge may occur within the structures of Comparative Examples 1 and 2. This is because the heat dissipation metal terminals 300, 22 are electrically floating.

In contrast, discharge does not occur within the wiring board 1 of Example 1 (FIG. 1) and the wiring board 1*a* of Example 2 (FIG. 4). This is because the heat dissipation metal terminal 22 and the heat dissipation plate 10 are electrically connected to each other.

As described above, the wiring board 1 according to the exemplary embodiment and the wiring board 1*a* according to the modification example of the exemplary embodiment exhibit high dielectric breakdown voltages. This is because the insulating layer 14 such as a polyimide layer which is much higher in insulation performance than the heat-conductive adhesive layer 12 is formed under the positive electrode 30 and the negative electrode 32 between which a high voltage is applied.

For example, the dielectric breakdown voltage of a polyimide layer, which is used as the insulating layer 14, is 5.9 kV in a case where the polyimide layer is provided solely (independently) and is 50 μm in thickness.

In contrast, the dielectric breakdown voltage of an epoxy resin layer containing an aluminum filler, which is used as the heat-conductive adhesive layer 12, is 3.4 kV when the epoxy resin layer is provided solely (independently) and is 50 μm in thickness.

Furthermore, in the exemplary embodiment and the modification example of the exemplary embodiment, the thermal via is higher in thermal conductivity than the insulating layer 14. Thus, the structures of the exemplary embodiment and the modification example of the exemplary embodiment are superior in heat dissipation performance.

Where the heat dissipation metal layer 20 (copper) is used as the thermal via, the thermal conductivity of the thermal via is 300 W/m·K. Where the heat dissipation resin layer 21 is used as the thermal via, the thermal conductivity of the thermal via is 3 W/m·K. In contrast, the thermal conductivity of the insulating layer 14 (polyimide layer) is 0.3 W/m·K.

As such, the wiring board 1 according to the exemplary embodiment and the wiring board 1*a* according to the modification example of the exemplary embodiment can prevent occurrence of internal discharge while securing high insulation performance and enhancing the heat dissipation performance.

Figure 9A:
FIGS. 9A to 9E are a first set of sectional views showing a method for manufacturing the wiring board according to the exemplary embodiment.

Next, a method for manufacturing the wiring board 1 according to the exemplary embodiment shown in FIG. 1 will be described. At first, as shown in FIG. 9A, an insulating layer 14 such as a polyimide film is prepared. Then, an adhesive layer (not shown) is applied to one surface of the insulating layer 14.

Figure 9B:
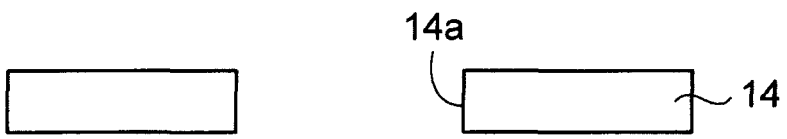
Figure 9C:
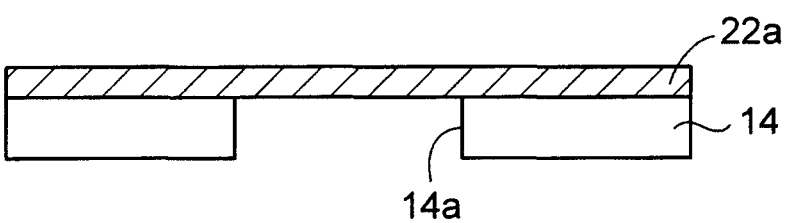

Then, as shown in FIG. 9B, an opening portion 14*a* is formed in the insulating layer 14. Specifically, the opening portion 14*a* is formed by press working using a die. The opening portion 14*a* penetrates through the insulating layer 14 in a thickness direction of the insulating layer 14. As shown in FIG. 9C, a copper foil 22a is stacked on the one surface, on which the adhesive layer is formed, of the insulating layer 14. The copper foil 22a is an example of a metal foil. A foil made of another metal may be used in place of the copper foil 22a.

Figure 9D:
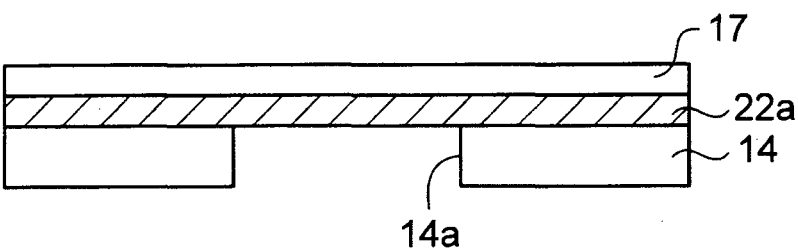

Then, as shown in FIG. 9D, a masking tape 17 is tentatively bonded to an exposed surface of the copper foil 22a.

Figure 9E:
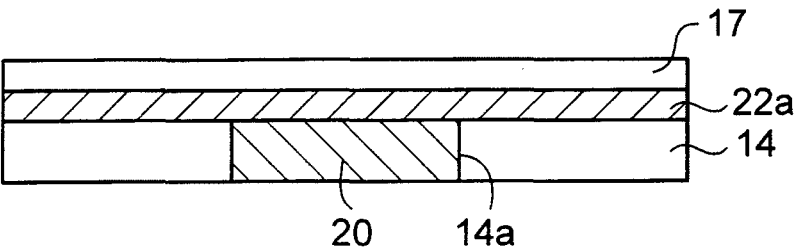
Figure 10A:
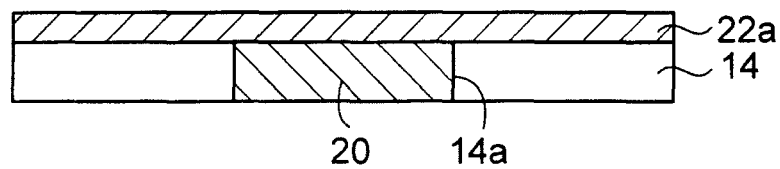
FIGS. 10A to 10D are a second set of sectional views showing the method for manufacturing the wiring board according to the exemplary embodiment.

Subsequently, a metal plating layer is formed in the opening portion 14a of the insulating layer 14 by electrolytic plating. The electrolytic plating uses the copper foil 22a as a plating power supply path. The metal plating layer is made of copper or the like. Thereby, a heat dissipation metal layer 20 is obtained as shown in FIG. 9E. Thereafter, the masking tape 17 is removed as shown in FIG. 10A.

Figure 10B:
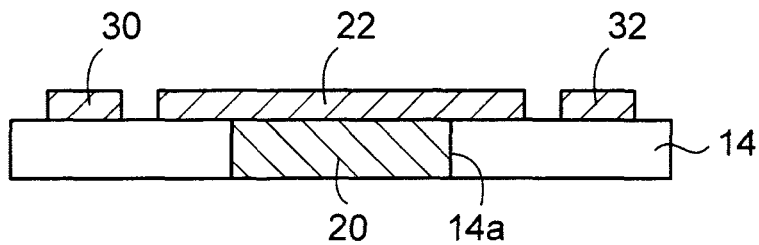

Then, as shown in FIG. 10B, the copper foil 22a is patterned by photolithography and wet etching. As a result, a heat dissipation metal terminal 22 is formed on the heat dissipation metal layer 20. Also, a positive electrode 30 and a negative electrode 32 are formed on the insulating layer 14 and outside the heat dissipation metal terminal 22.

Figure 10C:
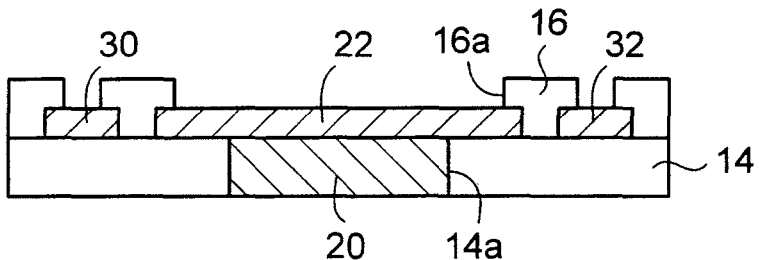

Then, as shown in FIG. 10C, a white solder resist layer 16 is formed on the insulating layer 14. The solder resist layer 16 is formed with opening portions 16a. The opening portions 16a penetrate through the solder resist layer 16. The opening portions 16a are located above upper surfaces of the heat dissipation metal terminal 22, the positive electrode 30, and the negative electrode 32, respectively.

Figure 10D:
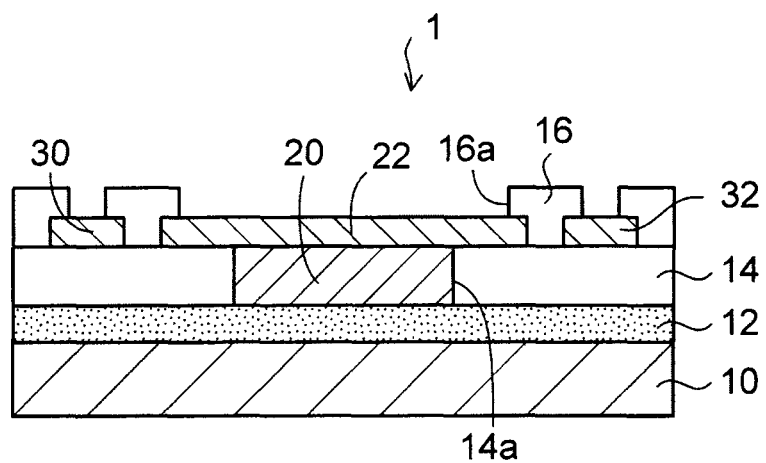

Subsequently, as shown in FIG. 10D, a lower surface of the structural body of FIG. 10C is placed on a heat dissipation plate 10 in such a manner that an epoxy resin layer containing an alumina filler is interposed therebetween. Then, the resin layer is cured by heat treatment. As a result, the lower surfaces of the insulating layer 14 and heat dissipation metal layer 20 of the structural body of FIG. 10C are bonded to the heat dissipation plate 10 by a heat-conductive adhesive layer 12. As a result, a wiring board 1 as shown in FIG. 1 is obtained.

Figure 11A:
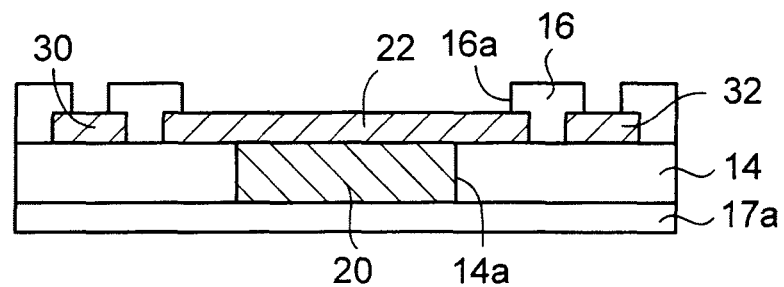
FIGS. 11A to 11D are a third set of sectional views showing the method for manufacturing the wiring board according to the exemplary embodiment.

A case where a contact layer 24 is formed on the surfaces of the heat dissipation metal terminal 22, the positive electrode 30, and the negative electrode 32 as shown in FIG. 6 will be described below. In this case, after the step of FIG. 10C, a masking tape 17a is tentatively bonded to the lower surfaces of the insulating layer 14 and the heat dissipation metal layer 20 as shown in FIG. 11A.

Figure 11B:
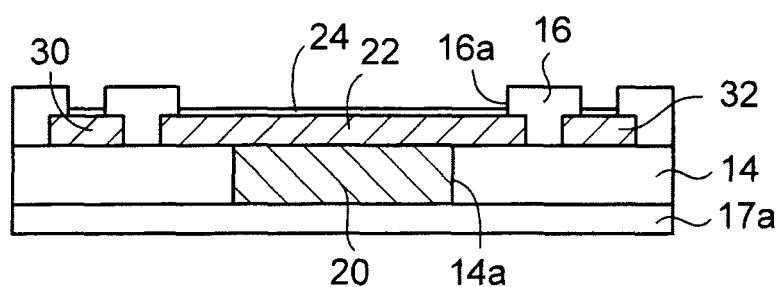

Then, as shown in FIG. 11B, a contact layer 24 is formed by forming a nickel layer and a gold layer in this order from the bottom on portions—exposed through the opening portions 16a of the solder resist layer 16—of the upper surfaces of the heat dissipation metal terminal 22, the positive electrode 30, and the negative electrode 32.

Figure 11C:
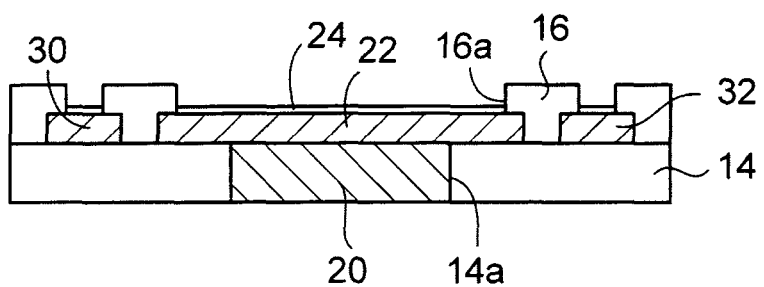
Figure 11D:
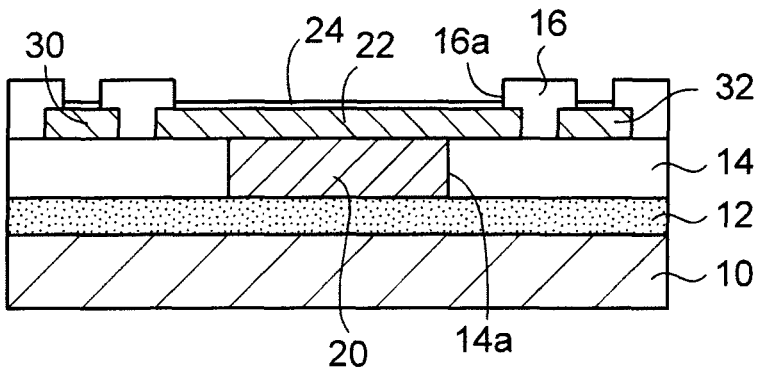

As shown in FIG. 11C, the masking tape 17a is thereafter removed. Subsequently, as shown in FIG. 11D, the heat dissipation plate 10 is bonded to a lower surface of the structural body of FIG. 11C by the heat-conductive adhesive layer 12 in the same manner as shown in FIG. 10D.

Where a large-size metal plate for production of multiple wiring boards is used as a heat dissipation plate, the structural bodies of FIG. 10C or 11C are bonded to respective product area portions defined in the large-size metal plate by the heat-conductive adhesive layer 12. Then, the large-size metal plate is divided.

Figure 12A:
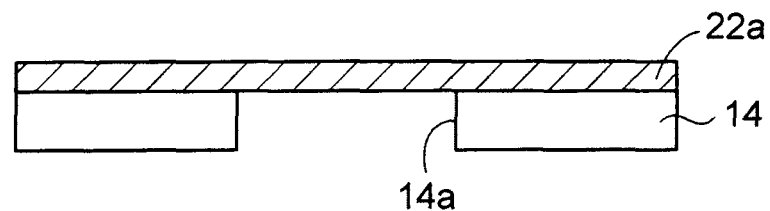
FIGS. 12A to 12D are sectional views showing a method for manufacturing the wiring board according to the modification.

Next, a method for manufacturing the wiring board 1a according to the modification example shown in FIG. 4 will be described. As shown in FIG. 12A, an opening portion 14a is formed through an insulating layer 14 and then a copper foil 22a is stacked to one surface of the insulating layer 14 in the same manner as shown in FIGS. 9A to 9C.

Figure 12B:
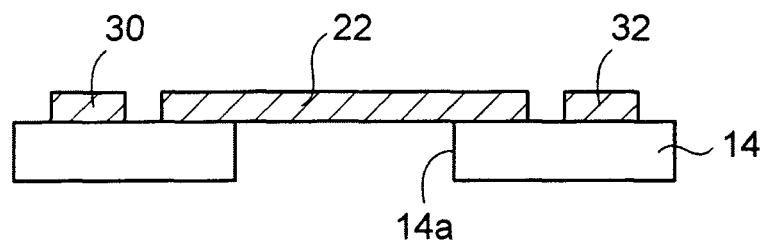

Then, as shown in FIG. 12B, the copper foil 22a is patterned by photolithography and wet etching. As a result, a heat dissipation metal terminal 22 is formed in a region including the opening portion 14a of the insulating layer 14. Also, a positive electrode 30 and a negative electrode 32 are formed on the insulating layer 14 and outside the heat dissipation metal terminal 22.

Figure 12C:
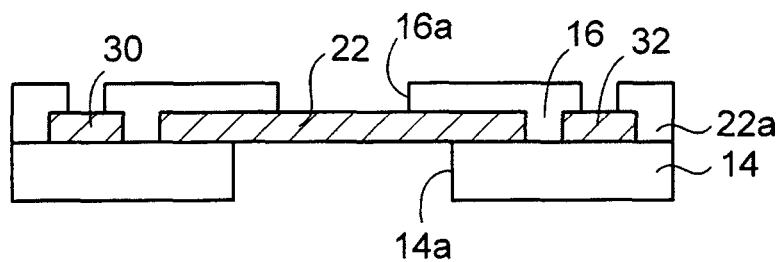

Then, as shown in FIG. 12C, a white solder resist layer 16 is formed on the insulating layer 14. The solder resist layer 16 is formed with opening portions 16a. The opening portions 16a penetrate through the solder resist layer 16. The opening portions 16a are located above upper surfaces of the heat dissipation metal terminal 22, the positive electrode 30, and the negative electrode 32, respectively.

Figure 12D:
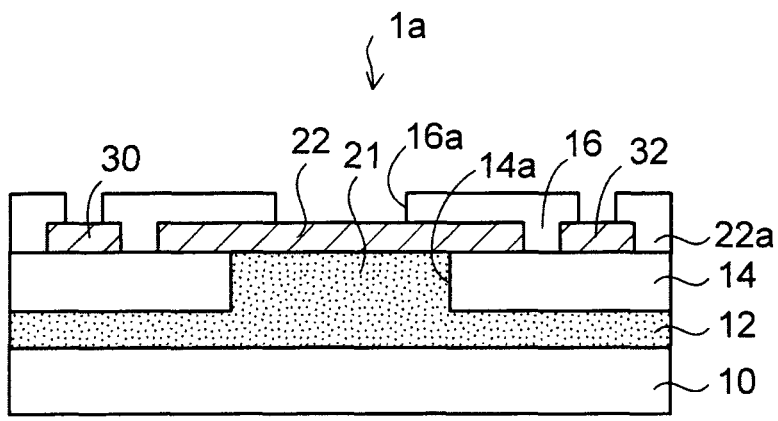

Subsequently, as shown in FIG. 12D, a heat dissipation plate 10 is placed on a lower surface of the insulating layer 14 and a lower surface of the copper foil 22a in such a manner that an epoxy resin layer containing an aluminum filler is interposed therebetween. Then, the resin layer is cured by heat treatment.

As a result, a heat-conductive adhesive layer 12 is formed on an upper surface of the heat dissipation plate 10. In other words, the heat-conductive adhesive layer 12 is formed between (i) the upper surface of the heat dissipation plate 10 and (ii) the lower surface of the insulating layer 14 and the opening portion 14a. Also, the opening portion 14a of the insulating layer 14 is filled with a heat dissipation resin layer 21. The heat dissipation resin layer 21 serves as a thermal via. The heat dissipation resin layer 21 is made of the same material as the heat-conductive adhesive layer 12.

Thus, the wiring board 1a according to the modification example as shown in FIG. 4 is obtained. The above method for manufacturing the wiring board 1a shown in FIG. 4 dispenses with an electrolytic plating step of forming a heat dissipation metal layer in the opening portion 14a of the insulating layer 14. Rather, the heat dissipation resin layer 21 and the heat-conductive adhesive layer 12 are formed simultaneously by forming the resin layer. As a result, the wiring board 1a according to the modification example shown in FIG. 4 can be manufactured at a lower cost than the wiring board 1 shown in FIG. 1.

Next, examples of wiring boards to which plural LED components are to be connected will be described in detail with reference to FIGS. 13A to 16B.

Figure 13A:
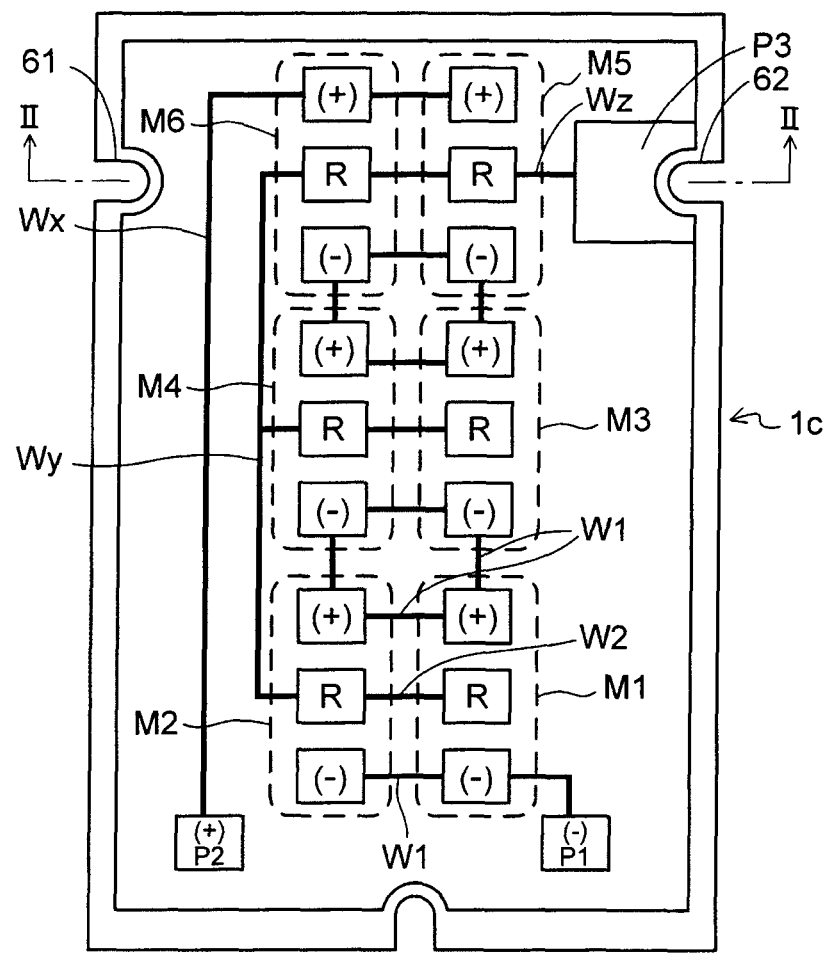
FIG. 13A is a plan view of a first wiring board to be mounted with plural LED components in series.

At first, description will be given on wiring boards of such a type that plural LED components are to be connected to each other in series. In FIG. 13A, a symbol (+) denotes a positive electrode 30, a symbol (−) denotes a negative electrode 32, and a symbol R denotes a heat dissipation metal terminal 22. These symbols also apply in FIGS. 14A to 16B which will be referred to later.

As shown in a plan view of FIG. 13A, six LED mounting regions, that is, first to sixth LED mounting regions M1 to M6 (enclosed by broken lines) are defined on a wiring board 1c. More specifically, the first to sixth LED mounting regions M1 to M6 are arranged in two columns and three rows. Each of the first to sixth LED mounting regions M1 to M6 is configured to be mounted with an LED component.

LED components are mounted in the first to sixth LED mounting regions M1 to M6, respectively. In each of the LED mounting regions M1 to M6, a heat dissipation metal terminal 22 (denoted by "R") is disposed in a center portion thereof. Also, in each of the LED mounting regions M1 to M6, a positive electrode 30 and a negative electrode 32 which are connected to the LED component are disposed on both sides of the heat dissipation metal terminal 22.

As for the first LED mounting region M1 and the second LED mounting region M2 which are arranged in the horizontal direction (row direction), the negative electrodes 32 are connected to each other by a wiring W1. Also, the positive electrodes 30 are connected to each other by another wiring W1. The negative electrode 32 in the first LED mounting region M1 is connected, by still another wiring W1, to a negative-side common pad P1 which is disposed near one end portion, in the vertical direction (column direction), of the wiring board 1c.

The third LED mounting region M3 and the fourth LED mounting region M4 are disposed to be distant from the first LED mounting region M1 and the second LED mounting region M2 in the vertical direction. The third LED mounting region M3 and the fourth LED mounting region M4 are arranged in the horizontal direction. Similarly to the first LED mounting region M1 and the second LED mounting region M2, the negative electrodes 32 in the third LED mounting region M3 and the fourth LED mounting region M4 are connected to each other by a wiring W1. Also, the positive electrodes 30 therein are connected to each other by another wiring W1.

Then, the positive electrode 30 in the first LED mounting region M1 is connected to the negative electrode 32 in the third LED mounting region M3 by further another wiring W1. Also, the positive electrode 30 in the second LED mounting region M2 is connected to the negative electrode 32 in the fourth LED mounting region M4 by still another wiring W1.

Likewise, the fifth LED mounting region M5 and the sixth LED mounting region M6 are disposed to be distant from the third LED mounting region M3 and the fourth LED mounting region M4 in the vertical direction. The fifth LED mounting region M5 and the sixth LED mounting region M6 are arranged in the horizontal direction. The negative electrodes 32 in the fifth LED mounting region M5 and the sixth LED mounting region M6 are connected to each other by a wiring W1. Also, the positive electrodes 30 therein are connected to each other by another wiring W1.

Then, the positive electrode 30 in the third LED mounting region M3 is connected to the negative electrode 32 in the fifth LED mounting region M5 by further another wiring W1. Also, the positive electrode 30 in the fourth LED mounting region M4 is connected to the negative electrode 32 in the sixth LED mounting region M6 by still another wiring W1.

The positive electrode 30 in the sixth LED mounting region M6 is connected, by a wiring Wx, to a positive-side common pad P2 which is disposed near the one end portion, in the vertical direction, of the wiring board 1c.

As described above, in the first to sixth LED mounting regions M1 to M6, the positive electrode 30 in one LED mounting region and the negative electrode 32 in another LED mounting region which are adjacent to each other in the vertical direction (column direction) are connected in series by the wiring W1.

With this configuration, when the LED components are connected to the positive electrodes 30 and the negative electrodes 32 in the first to sixth LED mounting regions M1 to M6, three pairs of LED components are electrically connected to each other in series between the negative-side common pad P1 and the positive-side common pad P2. Also, the LED components making up each pair are electrically connected to each other in parallel.

Furthermore, the heat dissipation metal terminals 22 (denoted by "R") in the first LED mounting region M1 and the second LED mounting region M2 are connected to each other by a wiring W2. Likewise, the heat dissipation metal terminals 22 in the third LED mounting region M3 and the fourth LED mounting region M4 are connected to each other by another wiring W2. The heat dissipation metal terminals 22 in the fifth LED mounting region M5 and the sixth LED mounting region M6 are connected to each other by further another wiring W2.

The heat dissipation metal terminals 22 in the second LED mounting region M2, the fourth LED mounting region M4, and the sixth LED mounting region M6 are connected to a common wiring Wy. Also, the heat dissipation metal terminal 22 in the fifth LED mounting region M5 is connected, by a wiring Wz, to a common pad P3 which is disposed near the other end portion, in the vertical direction (column direction), of the wiring board 1c.

In this manner, the heat dissipation metal terminals 22 in the first to sixth LED mounting regions M1 to M6 are connected to the common pad P3 by the wirings W2, the common wiring Wy, and the wiring Wz.

Furthermore, a through hole 62 is formed in the wiring board 1c. The through hole 62 extends from an upper surface of an outer end portion of the rectangular common pad P3 in the thickness direction of the wiring board 1c. The through hole 62 has a cut-out shape in a plan view. More specifically, the through hole 62 has a U shape (horseshoe shape) in a plan view.

The wiring board 1c is disposed in a similar manner to the wiring board 1 shown in FIG. 5. That is, as shown in a sectional view of FIG. 13B, the wiring board 1c of FIG. 13A is placed on a metal support body 50. An attachment screw 70 is inserted into the through hole 62 and screwed into a screw hole 64 of the metal support body 50.

Figure 13B:
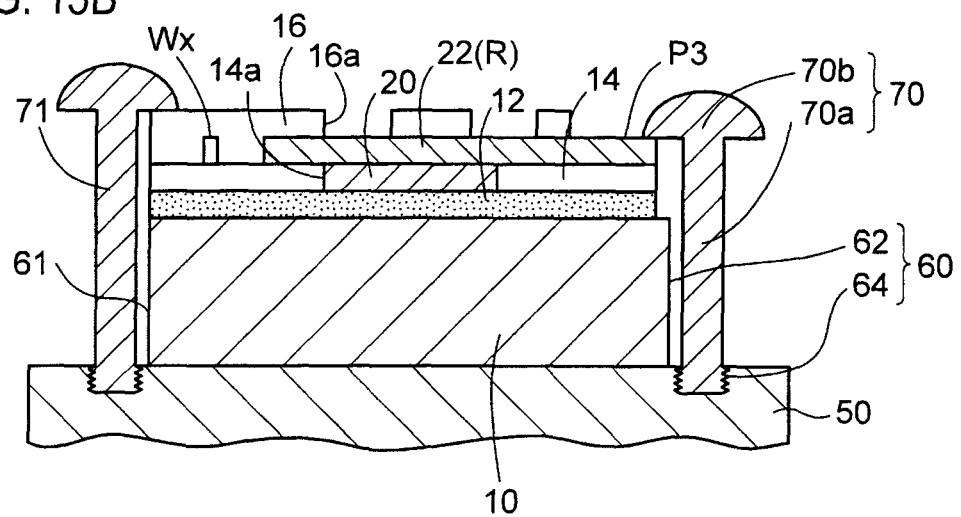
FIG. 13B is a sectional view of the first wiring board, taken along a line II-II in FIG. 13A.

FIG. 13B is a sectional view taken along a line II-II in FIG. 13A. In FIG. 13B, the two heat dissipation metal terminals 22 in the fifth and sixth LED mounting region M5, M6 and the common pad P3 are drawn like a single wiring. This also applies in FIGS. 14A to 16B which will be referred to later.

As a result, the common pad P3 which is connected to the respective heat dissipation metal terminals 22 of the wiring board 1c are electrically connected to the heat dissipation plate 10 via the attachment screw 70 and the metal support body 50.

Figure 14A:
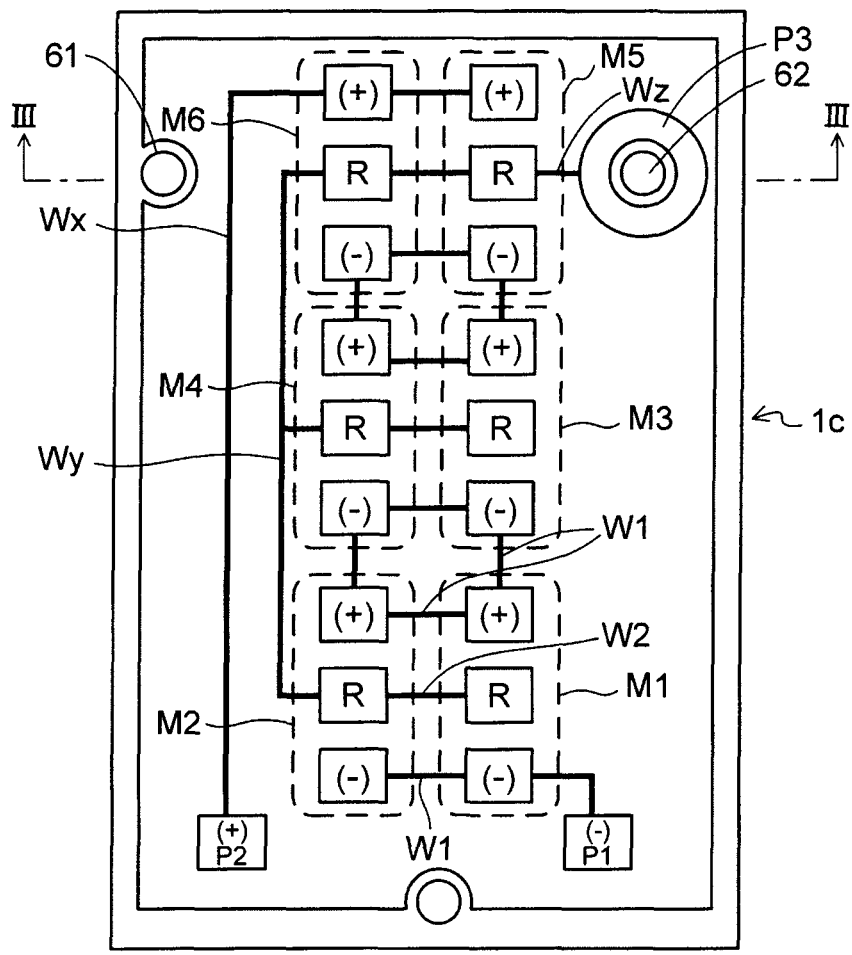
FIG. 14A is a plan view of a second wiring board to be mounted with plural LED components in series.

As shown in FIG. 14A, the through hole 62 may be formed in a region inside the outer edge of the wiring board 1c. In this case, the through hole 62 has a circle shape in a plan view. As described above, in the wiring board 1c, three pairs of LED components are electrically connected to each other in series. Also, the LED components making up each pair are electrically connected to each other in parallel.

A common pad P3 for the heat dissipation metal terminals 22 (denoted by "R") is formed in a region inside the outer edge of the wiring board 1c. The common pad P3 has a circle shape in a plan view. The through hole 62 is formed in a center portion of the common pad P3. The through hole 62 extends in the thickness direction of the wiring board 1c from the center portion of the common pad P3.

Figure 14B:
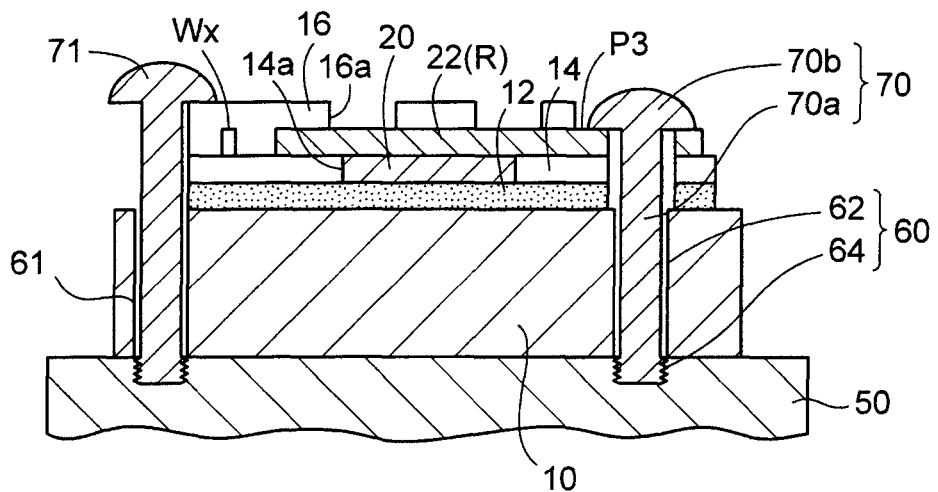
FIG. 14B is a sectional view of the second wiring board, taken along a line III-III in FIG. 14A.

The wiring board 1c is disposed in a similar manner to FIG. 13B. That is, as shown in a sectional view of FIG. 14B, the wiring board 1c of FIG. 14A is placed on a metal support body 50. An attachment screw 70 is inserted into the through hole 62 and screwed into a screw hole 64 of the metal support body 50. FIG. 14B is a sectional view taken along a line III-III in FIG. 14A.

As a result, the common pad P3 which is connected to the respective heat dissipation metal terminals 22 of the wiring board 1c are electrically connected to the heat dissipation plate 10 via the attachment screw 70 and the metal support body 50.

Next, description will be given on wiring boards of such a type that plural LED components are to be connected to each other in parallel.

Figure 15A:
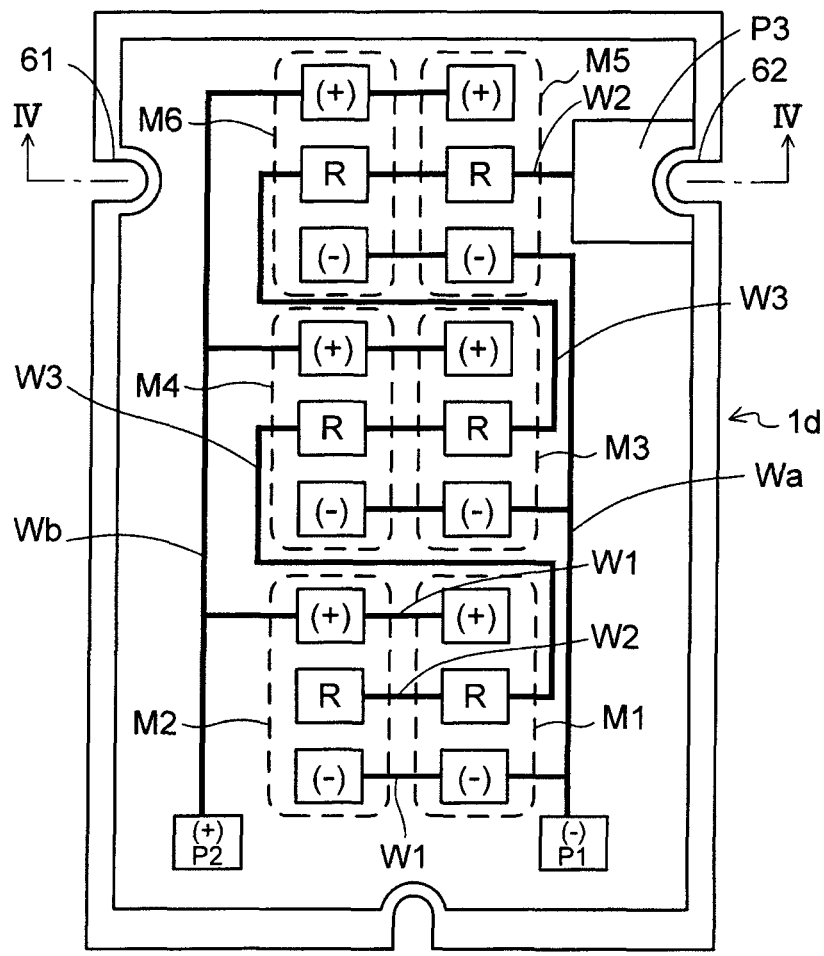
FIG. 15A is a plan view of a third wiring board to be mounted with plural LED components in parallel.

As shown in a plan view of FIG. 15A, six LED mounting regions, that is, first to sixth LED mounting regions M1 to M6 are defined on a wiring board 1d in a similar manner to FIG. 13A. Each of the first to sixth LED mounting regions M1 to M6 is configured to be mounted with an LED component.

As for the first LED mounting region M1 and the second LED mounting region M2 which are arranged in the horizontal direction (row direction), the negative electrodes 32 are connected to each other by a wiring W1. Also, the negative electrode 32 in the first LED mounting region M1 is connected to a negative-side common wiring Wa. The common wiring Wa is connected to a negative-side common pad P1. The common pad P1 is disposed near one end portion, in the vertical direction (column direction), of the wiring board 1d.

Furthermore, the positive electrodes 30 in the first LED mounting region M1 and the second LED mounting region M2 are connected to each other by another wiring W1. The positive electrode 30 in the second LED mounting region M2 is connected to a positive-side common wiring Wb.

Similarly, as for the third LED mounting region M3 and the fourth LED mounting region M4 which are arranged in the horizontal direction, the negative electrodes 32 are connected to each other by a wiring W1. The negative electrode 32 in the third LED mounting region M3 is connected to the negative-side common wiring Wa.

Furthermore, the positive electrodes 30 in the third LED mounting region M3 and the fourth LED mounting region M4 are connected to each other by another wiring W1. The positive electrode 30 in the fourth LED mounting region M4 is connected to the positive-side common wiring Wb.

Similarly, as for the fifth LED mounting region M5 and the sixth LED mounting region M6 which are arranged in the horizontal direction, the negative electrodes 32 are connected to each other by a wiring W1. The negative electrode 32 in the fifth LED mounting region M5 is connected to the negative-side common wiring Wa.

The positive electrodes 30 in the fifth LED mounting region M5 and the sixth LED mounting region M6 are connected to each other by another wiring W1. The positive electrode 30 in the sixth LED mounting region M6 is connected to the positive-side common wiring Wb. The positive-side common wiring Wb is connected to a positive-side common pad P2. The common pad P2 is disposed near to the one end portion, in the vertical direction, of the wiring board 1d.

As described above, the negative electrodes 32 in the first to sixth LED mounting regions M1 to M6 are connected to the negative-side common wiring Wa. Also, the positive electrodes 30 therein are connected to the positive-side common wiring Wb.

As a result, when LED components are connected to the positive electrodes 30 and the negative electrodes 32 in the first to sixth LED mounting regions M1 to M6, respectively, the LED components are electrically connected to each other in parallel between the negative-side common pad P1 and the positive-side common pad P2.

Furthermore, the heat dissipation metal terminals 22 (denoted by "R") in the first LED mounting region M1 and the second LED mounting region M2 are connected to each other by a wiring W2. The heat dissipation metal terminal 22 in the first LED mounting region M1 is connected to that in the fourth LED mounting region M4 by a wiring W3.

Likewise, the heat dissipation metal terminals 22 in the third LED mounting region M3 and the fourth LED mounting region M4 are connected to each other by another wiring W2. The heat dissipation metal terminal 22 in the third LED mounting region M3 is connected to that in the sixth LED mounting region M6 by another wiring W3.

The heat dissipation metal terminals 22 in the fifth LED mounting region M5 and the sixth LED mounting region M6 are connected to each other by a still another wiring W2. The heat dissipation metal terminal 22 in the fifth LED mounting region M5 is connected, by a further another wiring W2, to a common pad P3 for the heat dissipation metal terminals 22.

As a result, the heat dissipation metal terminals 22 in the first to sixth LED mounting regions M1 to M6 are connected to the common pad P3. The common pad P3 is disposed near the other end, in the vertical direction (column direction), of the wiring board 1d via the wirings W2 and W3.

Furthermore, similarly to FIG. 13A, a through hole 62 is formed in the wiring board 1d. The through hole 62 extends from an upper surface of an outer end portion of the common pad P3 in the thickness direction of the wiring board 1c. The through hole 62 has a cut-out shape in a plan view. More specifically, the through hole 62 has a U shape (horseshoe shape) in a plan view.

Figure 15B:
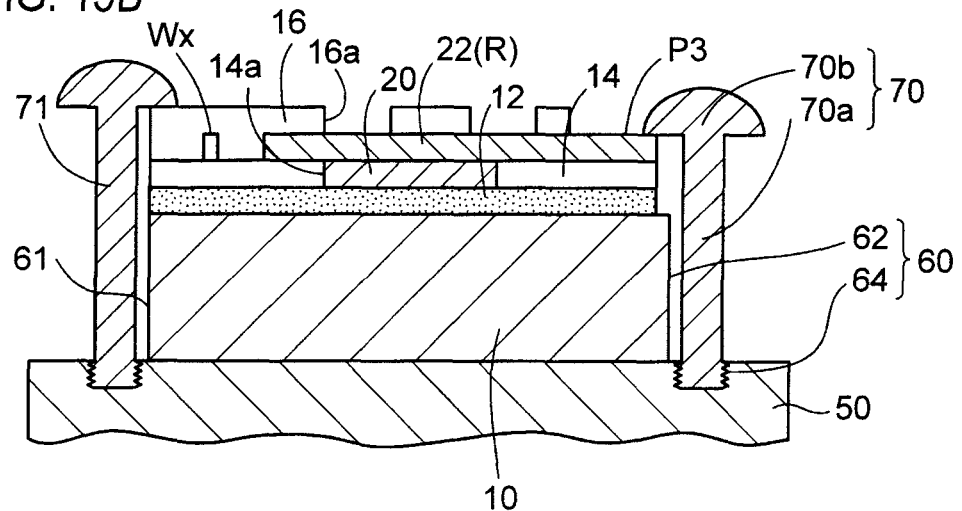
FIG. 15B is a sectional view of the third wiring board, taken along a line IV-IV in FIG. 15A.

The wiring board 1d is disposed in a similar manner to the wiring board 1c shown in FIG. 5. That is, as shown in a sectional view of FIG. 15B, the wiring board 1d is placed on a metal support body 50. An attachment screw 70 is inserted in the through hole 62 and screwed into a screw hole 64 of the metal support body 50. FIG. 15B is a sectional view taken along a line IV-IV in FIG. 15A.

As a result, the common pad P3 which is connected to the heat dissipation metal terminals 22 of the wiring board 1d are electrically connected to the heat dissipation plate 10 via the attachment screw 70 and the metal support body 50.

Figure 16A:
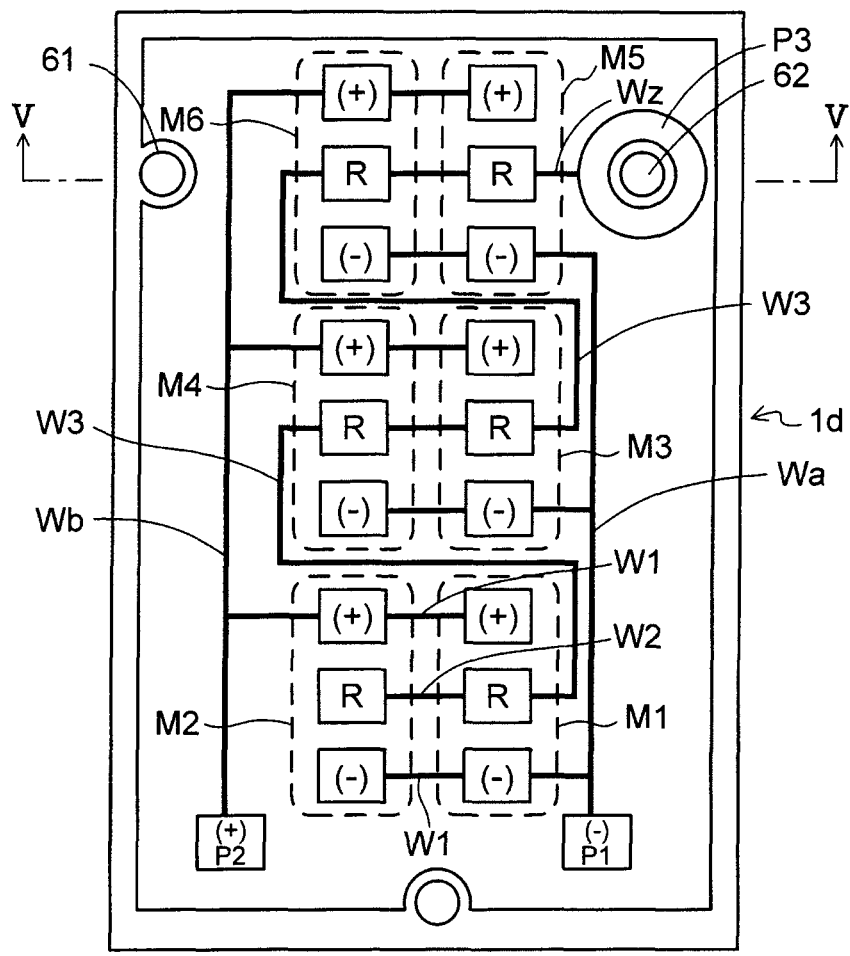
FIG. 16A is a plan view of a fourth wiring board to be mounted with plural LED components in parallel.

As shown in FIG. 16A, the through hole 62 may be formed in a region inside the outer edge of the wiring board 1d in a similar manner to FIG. 14A. In this case, the through hole 62 has a circle shape in a plan view. As described above, in the wiring board 1d, the LED components are electrically connected to each other in parallel in a similar manner to FIG. 15A.

Figure 16B:
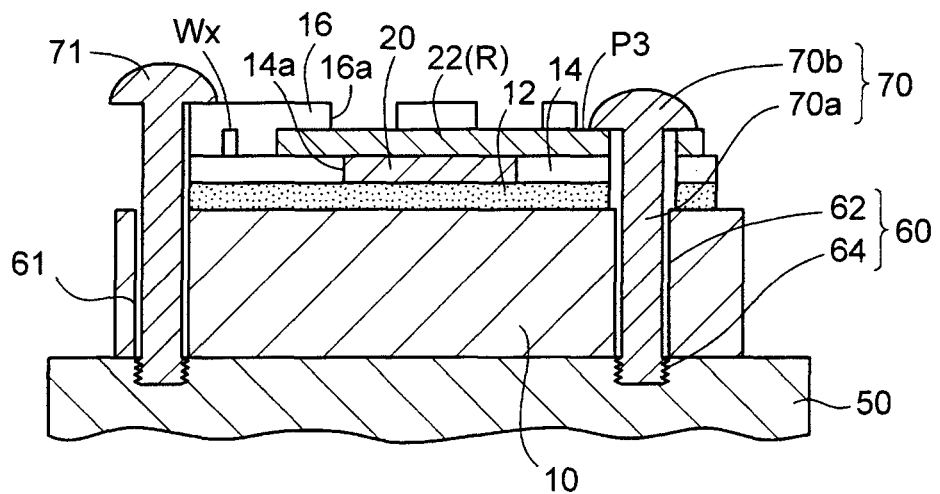
FIG. 16B is a sectional view of the fourth wiring board, taken along a line V-V in FIG. 16A.

Then, the wiring board of FIG. 16A is disposed in a similar manner to FIG. 14A. That is, as shown in a sectional view of FIG. 16B, the wiring board 1d of FIG. 16A is placed on a metal support body 50. An attachment screw 70 is inserted in the through hole 62 of the wiring board 1d and screwed into a screw hole 64 of the metal support body 50. FIG. 16B is a sectional view taken along a line V-V in FIG. 16A.

As a result, the common pad P3 which is connected to the heat dissipation metal terminals 22 of the wiring board 1d are electrically connected to the heat dissipation plate 10 via the attachment screw 70 and the metal support body 50.

CLAUSES

This disclosure further encompasses various exemplary embodiments, for example, described below.

1. A method for manufacturing a wiring board, the method comprising:

forming an opening portion through an insulating layer;

bonding a metal foil to one surface of the insulating layer;

forming a metal plating layer in the opening portion of the insulating layer by electrolytic plating using the metal foil as a plating power supply path, to form a thermal via;

patterning the metal foil to form a heat dissipation metal terminal on the thermal via and to form electrodes on the insulating layer;

bonding a heat dissipation plate to the other surface of the insulating layer with a heat-conductive adhesive layer interposed therebetween, the other surface of the insulating layer being opposed to the one surface of the insulating layer; and electrically connecting the heat dissipation metal terminal and the heat dissipation plate to each other.

2. The method of the clause 1, wherein
the electrically connecting comprises:

after the bonding the heat dissipation plate, placing the heat dissipation plate on a metal support body;

screwing an attachment screw into a screw attachment hole extending from an upper surface of the heat dissipation metal terminal to the metal support body, and the heat dissipation metal terminal is electrically connected to heat dissipation plate via the attachment screw and the metal support body.

3. The method of the clause 1, wherein the heat dissipation metal terminal and the heat dissipation plate are grounded.

What is claimed is:

1. A wiring board comprising:
   a heat dissipation plate;
   a heat-conductive adhesive layer disposed on the heat dissipation plate;
   an insulating layer disposed on the heat-conductive adhesive layer, the insulating layer being formed with an opening portion;
   a thermal via disposed in the opening portion of the insulating layer;
   a heat dissipation metal terminal disposed on the thermal via and electrically connected via an electrical connector to the heat dissipation plate; and
   electrodes disposed on the insulating layer, the electrodes to be connected to an electronic component.

2. The wiring board according to claim 1, wherein the heat dissipation metal terminal and the heat dissipation plate are grounded.

3. The wiring board according to claim 1, wherein the thermal via is higher in thermal conductivity than the insulating layer.

4. The wiring board according to claim 1, wherein the thermal via is made of copper.

5. The wiring board according to claim 1, wherein the thermal via is made of the same material as the heat-conductive adhesive layer.

6. The wiring board according to claim 1, wherein the insulating layer is higher in dielectric breakdown voltage than the heat-conductive adhesive layer.

7. The wiring board according to claim 1, wherein the heat-conductive adhesive layer is disposed between (i) the heat dissipation plate and (ii) the insulating layer and the thermal via.

8. The wiring board according to claim 1, further comprising:
   a solder resist layer disposed on the insulating layer, wherein
   the solder resist layer is provided between the heat dissipation metal terminal and the electrodes.

9. The wiring board according to claim 1, further comprising:
   a metal support body disposed under the heat dissipation plate; and
   an attachment screw, wherein
   a screw attachment hole is defined to extend from an upper surface of the heat dissipation metal terminal to the metal support body,
   the attachment screw is screwed in the screw attachment hole, and
   the attachment screw and the metal support body are the electrical connector by which the heat dissipation metal terminal is electrically connected to the heat dissipation plate.

10. The wiring board according to claim 9, wherein the screw attachment hole is a cutout having a U shape in a plan view.

11. The wiring board according to claim 9, wherein the screw attachment hole has a circle shape in a plan view.

12. The wiring board according to claim 9, wherein a portion of the screw attachment hole defined in the metal support body is threaded.

13. An electronic device comprising:
   the wiring board according to claim 1; and
   an electric component mounted on the wiring board and connected to the electrodes.

* * * * *